(12) United States Patent
Kitamura

(10) Patent No.: US 11,835,582 B2
(45) Date of Patent: Dec. 5, 2023

(54) SECONDARY BATTERY STATE ESTIMATION DEVICE

(71) Applicant: HONDA MOTOR CO., LTD., Tokyo (JP)

(72) Inventor: Toru Kitamura, Saitama (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 17/678,022

(22) Filed: Feb. 23, 2022

(65) Prior Publication Data

US 2022/0299571 A1 Sep. 22, 2022

(30) Foreign Application Priority Data

Mar. 19, 2021 (JP) ................. 2021-046618

(51) Int. Cl.
  *G01R 31/36* (2020.01)
  *G01R 31/367* (2019.01)
  *G01R 31/392* (2019.01)
  *G01R 31/3842* (2019.01)

(52) U.S. Cl.
  CPC ....... *G01R 31/3648* (2013.01); *G01R 31/367* (2019.01); *G01R 31/3842* (2019.01); *G01R 31/392* (2019.01)

(58) Field of Classification Search
  CPC ............ G01R 31/392; G01R 31/3648
  USPC ........................................... 702/63
  See application file for complete search history.

(56) References Cited

U.S. PATENT DOCUMENTS

| | | | | |
|---|---|---|---|---|
| 10,254,346 | B2* | 4/2019 | Nishiguchi | G01R 31/367 |
| 2016/0131720 | A1* | 5/2016 | Baba | G01R 31/367 |
| | | | | 702/63 |
| 2016/0252585 | A1* | 9/2016 | Baba | H02J 7/005 |
| | | | | 702/63 |
| 2016/0356855 | A1* | 12/2016 | Tamegai | H01M 10/44 |
| 2020/0033416 | A1* | 1/2020 | Takegami | H02J 7/00 |
| 2020/0371163 | A1* | 11/2020 | Du | G01R 31/367 |

FOREIGN PATENT DOCUMENTS

| | | |
|---|---|---|
| EP | 2605327 A1 | 6/2013 |
| JP | 2012037464 A | 2/2012 |

* cited by examiner

*Primary Examiner* — Ricky Go
(74) *Attorney, Agent, or Firm* — CKC & PARTNERS CO., LLC

(57) ABSTRACT

A secondary battery state estimation device includes: a state measurer configured to measure state variables including a terminal current and a terminal voltage of a secondary battery; an internal resistance calculator configured to calculate internal resistance of the secondary battery; an estimated open-circuit-voltage (OCV) calculator configured to calculate an estimated OCV; an estimated state-of-charge (SOC) calculator configured to calculate an estimated SOC, by using an SOC-OCV characteristic model; a differential estimated SOC calculator configured to calculate a differential estimated SOC; an integrated terminal current calculator configured to calculate an integrated terminal current; and a state-of-health (SOH) calculator configured to calculate an SOH. The SOH that the SOH calculator has calculated in a high SOC state where at least the estimated OCV is equal to or above a first threshold value is entered into an SOH estimation model used to estimate the SOH to update the SOH estimation model.

2 Claims, 13 Drawing Sheets

SECONDARY BATTERY STATE ESTIMATION DEVICE

This application is based on and claims the benefit of priority from Japanese Patent Application No. 2021-046618, filed on 19 Mar. 2021, the content of which is incorporated herein by reference.

BACKGROUND OF THE INVENTION

Field of the Invention

The present invention relates to a secondary battery state estimation device.

Related Art

Japanese Unexamined Patent Application, Publication No. 2012-037464 describes a lead battery used in a system utilizing natural energy. The lead battery includes: a battery state measurer configured to estimate a state of the lead battery; a state-of-charge (SOC) model representing a relationship between output factors, including a current, a voltage, and a temperature of the lead battery, and a state of charge in the lead battery; and an equalized charge implementor configured to implement equalized charging in the lead battery. Furthermore, the lead battery is provided with: an SOC estimator configured to estimate a state of charge in the lead battery from information of measurements performed by the battery state measurer and information of the SOC model; an SOC transition database (DB) recording how the state of charge in the lead battery has transitioned; an SOC transition history controller configured to record, in the SOC transition DB, a value of the state of charge that the SOC estimator has estimated, and to investigate a transition situation of the SOC; a degradation model representing a relationship between an operation situation of the lead battery, including the state of charge in the lead battery, and degradation; and an equalized charge optimum planner configured to plan an optimum implementation method for equalized charging, based on information of the SOC transition situation provided from the SOC transition history controller and the degradation model.

Such a lead battery as described above represents a simplified model where no SOC-Open-Circuit-Voltage (OCV) characteristics change, but a change in the SOH and a degree of soundness are estimated from a change in SOC, which is acquired from a change in OCV, and the SOC acquired from integrated currents. Furthermore, a state of health (SOH) is estimated only in an SOC region where there is a small change in the SOH in the SOC-OCV characteristics.

Patent Document 1: Japanese Unexamined Patent Application, Publication No. 2012-037464

SUMMARY OF THE INVENTION

However, the SOH actually changes, and the SOC-OCV characteristics also change, as time passes. Therefore, there may be difficulties in correctly estimating the SOH. Furthermore, in an SOC region where there are relatively greater negative effects when estimating an SOH, the SOH will not be correctly calculated, making it impossible to know a state of the lead battery. Such issues as described above may generally and commonly lie in not only lead batteries, but also secondary batteries.

In view of the issues described above, an object of the present invention is to provide a secondary battery state estimation device, which is able to correctly estimate a state of the secondary battery ever, if SOC-OCV characteristics are unknown, and, furthermore, even in an SOC region where there are relatively greater negative effects when estimating an SOH.

(1) A secondary battery state estimation device (e.g., a secondary battery state estimation device 1 described later), according to the present invention, includes: a state measurer (e.g., a state measurer 10, described later) configured to measure, at predetermined time intervals, state variables including a terminal current and a terminal voltage of the secondary battery (e.g., a secondary battery 2, described later) when in operation; an internal resistance calculator (e.g., an internal resistance calculator 11, described later) configured to calculate internal resistance of the secondary battery, by using the state variables; an estimated OCV calculator (e.g., an estimated OCV calculator 12, described later) configured to calculate an estimated OCV representing an estimated value of the terminal voltage in an opened state, by using the state variables and the internal resistance; an estimated SOC calculator (e.g., an estimated SOC calculator 14, described later) configured to calculate, from the estimated OCV, an estimated SOC representing an estimated value of a percentage of charge in the secondary battery, by using an SOC-OCV characteristic model (e.g., an SOC-OCV characteristic model 13, described later) representing a relationship between an SOC representing a percentage of charge in the secondary battery and an OCV representing the terminal voltage in the opened state; a differential estimated SOC calculator (e.g., a differential estimated SOC calculator 15, described later) configured to calculate a differential estimated SOC representing an amount of change, per unit time, in the estimated SOC, by using the estimated SOC; an integrated terminal current calculator (e.g., an integrated terminal current calculator 16, described later) configured to calculate an integrated terminal current representing an integrated amount, per unit time, of the terminal current, by using the state variables; and an SOH calculator (e.g., an SOH calculator 17, described later) configured to calculate an SOH representing an electricity storage capacity in the secondary battery, by using the differential estimated SOC and the integrated terminal current. The SOH that the SOH calculator has calculated in a high SOC state where at least the estimated OCV is equal to or above a first threshold value is entered into an SOH estimation model (e.g., an SOH estimation model 18, described later) used to estimate the SOH to update the SOH estimation model.

In a region where an SOC state is at a higher level where an estimated OCV is equal to or above the first threshold value that is set for each type of the secondary battery, the SOC-OCV characteristic models for the various types of secondary batteries have relatively less variability. Therefore, according to the secondary battery state estimation device as described in (1) pertaining to the present invention, it is possible to accurately estimate an SOH in a region where an SOC state is at a higher level where there are less variations in SOC-OCV characteristics. It is also possible to accurately update (to perform learning for) an SOH estimation model by using the SOH that has been accurately estimated.

(2) The secondary battery state estimation device as described in (1) may include: a differential SOC calculator (e.g., a differential SOC calculator 20, described later) configured to calculate a differential SOC representing an amount of change, per unit time, in a percentage of charge in the secondary battery, by using the integrated terminal current and the SOH in the SOH estimation model; an SOC calculator (e.g., an SOC calculator 21, described later) configured to calculate an SOC representing a percentage of charge in the secondary battery, by using the differential SOC and the estimated SOC that is acquired the unit time ago; an OCV calculator (e.g., an OCV calculator 22, described later) configured to calculate, from the SOC, an OCV representing the terminal voltage in the opened state, by using the SOC-OCV characteristic model; and an OCV error calculator (e.g., an OCV error calculator 23, described later) configured to calculate an OCV error representing an error between the estimated OCV and the COV, by using the estimated OCV and the OCV. In a medium SOC state where the estimated OCV is below the first threshold value and equal to or above a second threshold value that is smaller than the first threshold value, the SOC and the OCV error may be entered into the SOC-OCV characteristic model to update the SOC-OCV characteristic model.

In a region where an SOC state is at a medium level where an estimated OCV is below the first threshold value and equal to or above the second threshold value the SOC-OCV characteristic models for the various types of secondary batteries have relatively more variability. Therefore according to the secondary battery state estimation device as described in (2) pertaining to the present invention no update takes place for an SOH estimation model in a region where an SOC state is at a medium level. However a differential SOC and an SOC are calculated from an integrated terminal current. It is therefore possible to update the SOC-OCV characteristic model based on an error between an OCV, which is calculated from the calculated SOC and the SOC-OCV characteristic model, and an estimated OCV. Therefore according to the secondary battery state estimation device as described in (2) pertaining to the present invention, it is possible to more accurately estimate an SOC. Furthermore, it is possible to update (to perform learning for) an unknown SOC-OCV characteristic model.

(3) In the secondary battery state estimation device as described in (1), the state variables may include a temperature relating to the secondary battery. The secondary battery state estimation device may include: a heat generation amount calculator (e.g., a heat generation amount calculator 30, described later) configured to calculate an amount of heat generated in the secondary battery, by using the state variables; and a minimum OCV calculator (e.g., a minimum OCV calculator 31, described later) configured to regard the estimated OCV at a point of time when the amount of heat generated has reached a predetermined threshold value as a minimum OCV representing a minimum value of the terminal voltage in the opened state. The minimum OCV may be entered into the SOC-OCV characteristic model to update the SOC-OCV characteristic model.

According to the secondary battery state estimation device as described in (3) pertaining to the present invention, it is possible to regard, as a minimum OCV, an estimated OCV at a point of time when an amount of heat generated in the secondary battery has reached a predetermined threshold value to update the SOC-OCV characteristic model. Therefore, according to the secondary battery state estimation device as described in (3) pertaining to the present invention, it is possible to more accurately estimate an SOC in the whole SOC region. Furthermore, it is possible to update (to perform learning for) an unknown SOC-OCV characteristic model.

(4) The secondary battery state estimation device as described in (3) may include: a plurality of battery packs (e.g., battery packs 3, 4, 5, described later) each at least including the secondary battery, the plurality of battery packs being coupled in parallel to each other; a plurality of coupling switches (e.g., coupling switches 6, 7, 8, described later) respectively provided in a corresponding manner to the plurality of battery packs, the plurality of coupling switches being each configured to be switched between a coupled state and a decoupled state for supplying of electric power from each of the battery packs; and a controller (e.g., a controller 9, described later) configured to control the plurality of coupling switches. The controller may control the plurality of coupling switches to switch only one of the plurality of coupling switches to the coupled state to sequentially update the SOC-OCV characteristic model in each of the plurality of battery packs.

According to the secondary battery state estimation device as described in (4) pertaining to the present invention, before a whole SOC of a battery module including a plurality of battery packs reaches 0%, it is possible to sequentially update a lower limit OCV where an SOC reaches 0% for each of the battery packs. Therefore, it is possible to prevent the whole SOC in the battery module from suddenly reaching 0% when a vehicle is traveling, for example.

(5) In the secondary battery state estimation device as described in (4), the controller may control, each time charging and discharging of electricity take place, the plurality of coupling switches to switch only one of the plurality of coupling switches to the coupled state to sequentially update the SOC-OCV characteristic model in each of the plurality of battery packs.

According to the secondary battery state estimation device as described in (5) pertaining to the present invention, even in a case where a battery pack has been replaced and no update takes place (no learning has been performed) for its SOC-OCV characteristic model, it is possible to use a lower limit OCV for another battery pack, which has been updated (learning has been performed) as a first one, for updating (performing learning for) the other battery pack. Furthermore, performing updates (performing learning) in order makes it possible to update (to perform learning for) SOC-OCV characteristic models for all battery packs.

According to the present invention, it is possible to provide a secondary battery state estimation device, which is able to correctly estimate a state of the secondary battery even if no SOC-OCV characteristics are known, and, furthermore, even in an SOC region where there are relatively greater negative effects when estimating an SOH.

DETAILED DESCRIPTION OF THE INVENTION

Figure 1:
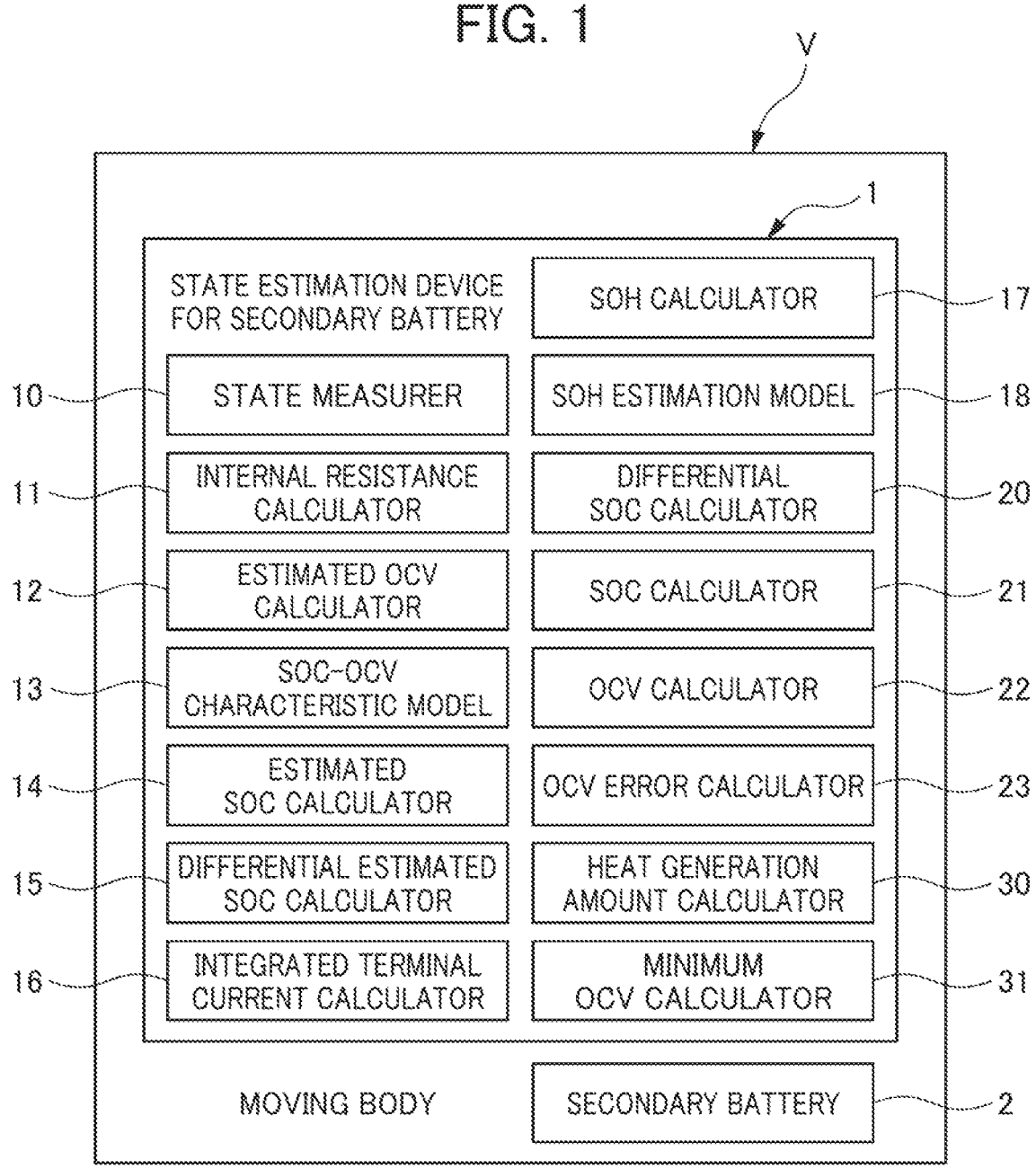
FIG. 1 is a block diagram illustrating a configuration of a moving body adopted with a secondary battery state estimation device, according to a first embodiment.

Embodiments according to the present invention will now be described herein in detail with reference to the accompanying drawings. Note that, in below descriptions for a second embodiment, like reference numerals designate identical or corresponding configurations, workings, and effects to those in a first embodiment, and their descriptions are thus appropriately omitted.

First Embodiment

A configuration of a moving body V representing an electric vehicle, for example, adopted with a secondary battery state estimation device 1, according to the first embodiment of the present invention, will now first be described herein with reference to FIG. 1. FIG. 1 is a block diagram illustrating the configuration of the moving body V adopted with the secondary battery state estimation device 1.

As illustrated in FIG. 1, the moving body V includes the secondary battery state estimation device 1 and a secondary battery 2, for example. The secondary battery 2 is replaceable with respect to the moving body V. An SOC-OCV characteristic model 13 varies as the secondary battery 2 varies in type. In the secondary battery 2, an SOC [%] representing a percentage of charge varies through discharging and charging of electricity. Furthermore, the secondary battery 2 degrades through the discharging and charging of electricity of electricity. Therefore, an SOH representing an electricity storage capacity decreases. To deal with this issue, the secondary battery state estimation device 1 includes the SOC-OCV characteristic model 13 that is commonly used. The SOC-OCV characteristic model 13 is updated for the secondary battery 2 through learning. In addition, an SOH estimation model 18 is updated for use in estimating an SOH representing the electricity storage capacity. Therefore, a state of the secondary battery 2 is correctly estimated.

Specifically, the secondary battery state estimation device 1 includes a state measurer 10, an internal resistance calculator 11, an estimated OCV calculator 12, the SOC-OCV characteristic model 13, an estimated SOC calculator 14, a differential estimated SOC calculator IS, an integrated terminal current calculator 16, an SOH calculator 17, the SOH estimation model IS, a differential SOC calculator 20, an SOC calculator 21, an OCV calculator 22, an OCV error calculator 23, a heat generation amount calculator 30, and a minimum OCV calculator 31, for example.

The state measurer 10 is configured to measure, at predetermined time intervals, state variables including a terminal current and a terminal voltage of the secondary battery 2 when in operation, and to measure a temperature relating to the secondary battery 2 when in operation (e.g., a temperature of the secondary battery 2 itself and a temperature of a cooling fluid for the secondary battery 2).

The internal resistance calculator 11 is configured to calculate internal resistance of the secondary battery 2, by using the state variables that the state measurer 10 has measured.

The estimated OCV calculator 12 is configured to calculate an estimated OCV representing an estimated value of the terminal voltage in an opened state, by using the state variables that the state measurer 10 has measured and the internal resistance that the internal resistance calculator 11 has calculated. That is, the estimated OCV calculator 12 is configured to calculate an estimated OCV representing an estimated value of the terminal voltage in the opened state, by using the terminal current and the terminal voltage that the state measurer 10 has measured and the internal resistance that the internal resistance calculator 11 has calculated.

The SOC-OCV characteristic model 13 represents a set of a plurality of pieces of grid point data each representing a relationship between an SOC [%] representing a percentage of charge in the secondary battery 2 and an OCV [V] representing a terminal voltage in the opened state. The set of the plurality of pieces of grid point data forms a curve (see FIG. 4). In a region where an SOC state is at a higher level where an OCV [V] is equal to or above a first threshold value (e.g., 3.8 [V]), there is less variability in the SOC [%]. In a region where an SOC state is at a medium level where an OCV [V] is below the first threshold value and equal to or above a second threshold value (e.g., 3.5 [V]) that is smaller than the first threshold value, there is more variability in the SOC [%]. In a region where an SOC state is at a lower level where an OCV [V] is below the second threshold value, there is less variability in the SOC [%].

The SOC-OCV characteristic model 13 is updated through learning. Specifically, in a medium SOC state where the estimated OCV [V] that the estimated OCV calculator 12 has calculated is below the first threshold value (e.g., 3.8 [V]) and equal to or above the second threshold value (e.g., 3.5 [V]) that is smaller than the first threshold value, an SOC [%] that the SOC calculator 21 calculates and an OCV error that the OCV error calculator 23 calculates are entered into the SOC-OCV characteristic model 13 to update the SOC-OCV characteristic model 13. More specifically, in such a medium SOC state, the SOC-OCV characteristic model 13 is updated by using an annealing coefficient k2 (0<k2<1) (see FIG. 4). The OCV [V] in the updated SOC-OCV characteristic model 13 is represented by OCV [V]=OCV [previous time]+ΔOCV×k2.

Figure 9:
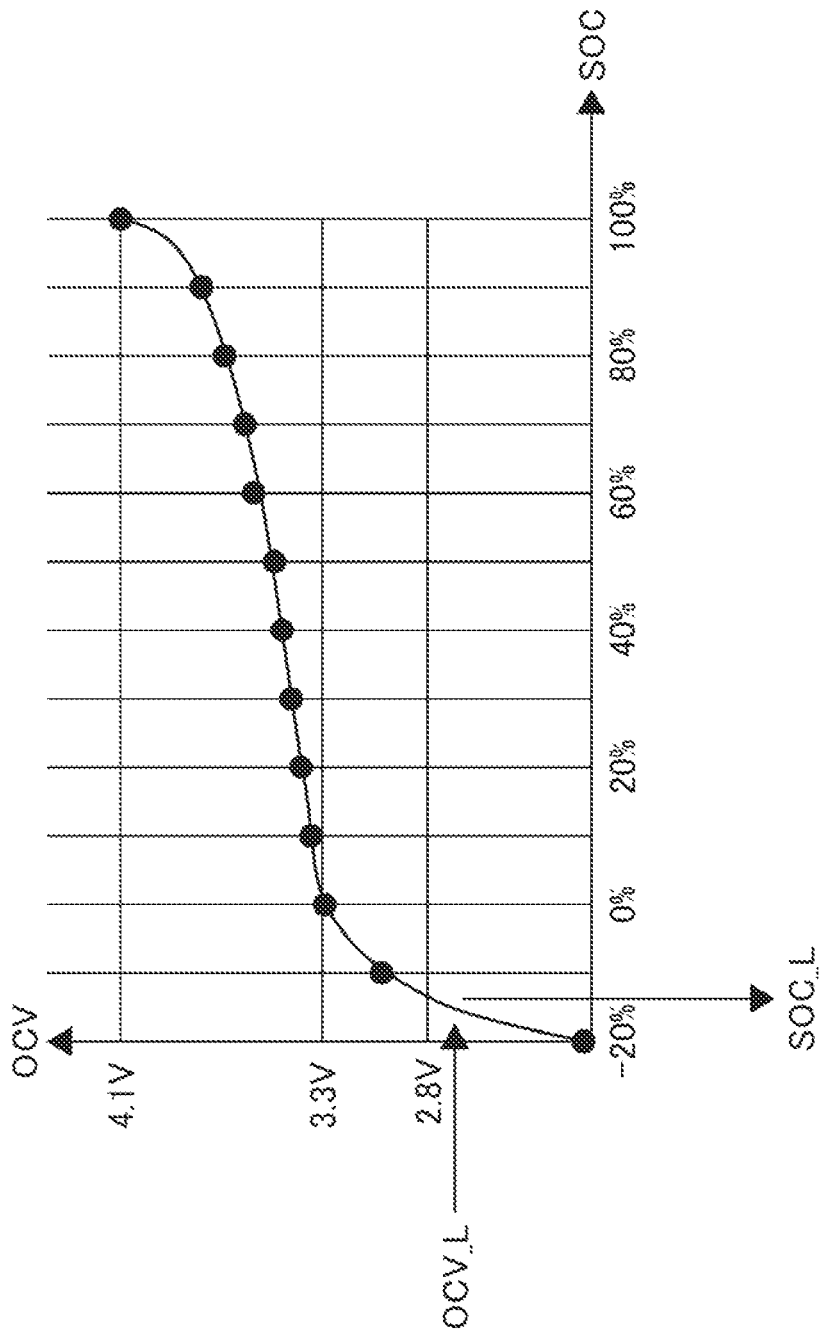
FIG. 9 is a table of an SOC-OCV characteristic model, illustrating an SOC (SOC_L) corresponding to an estimated OCV (OCV_L) at a point of time when the amount of heat generated in the secondary battery has reached the predetermined threshold value.
Figure 10:
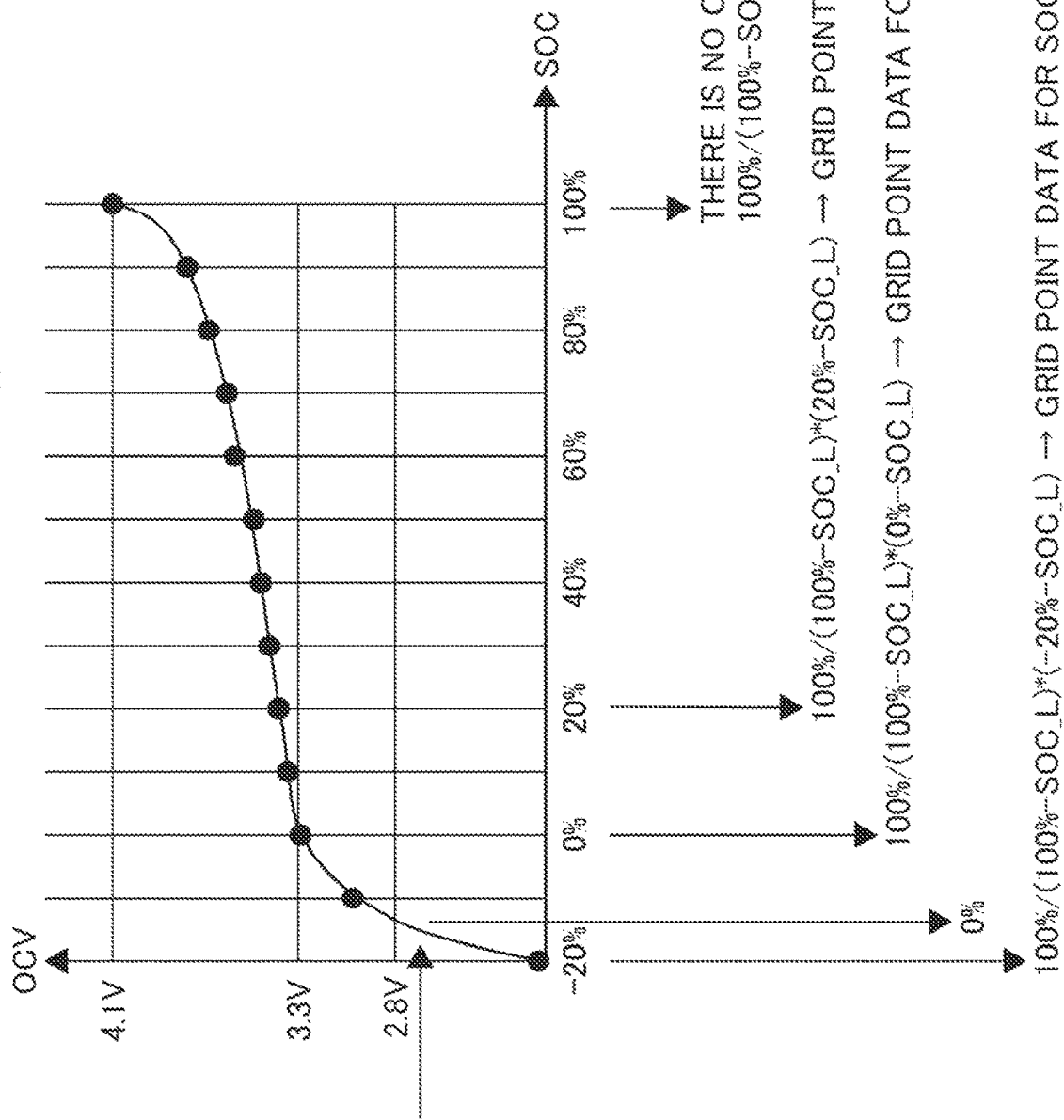
FIG. 10 is a table of an SOC-OCV characteristic model, illustrating calculating equations for updating an SOC in each grid point data.

Furthermore, when an amount of heat generated in the secondary battery 2 has reached a predetermined threshold value, a minimum OCV that the minimum OCV calculator 31 calculates is entered into a predetermined conversion equation to update the SOC-OCV characteristic model 13 (see FIGS. 9 and 10).

The estimated SOC calculator 14 is configured to calculate, from the estimated OCV that the estimated OCV calculator 12 has calculated, an estimated SOC representing an estimated value of a percentage of charge in the secondary battery 2, by using the SOC-OCV characteristic model 13.

The differential estimated SOC calculator 15 is configured to calculate a differential estimated SOC representing an amount of change, per unit time T [sec], in the estimated SOC, by using the estimated SOC that the estimated SOC calculator 14 has calculated. The differential estimated SOC is represented by $\Delta SOC\_v\ [\%] = SOC\ [T\ [sec]\ ago] - SOC\ [present]$.

The integrated terminal current calculator 16 is configured to calculate an integrated terminal current representing an integrated amount, per unit time T [sec], of the terminal current, by using the state variables that; the state measurer 10 has measured. That is, the integrated terminal current calculator 16 is configured to calculate an integrated terminal current representing an integrated amount, per unit time T [sec], of the terminal current, by using the terminal current that the state measurer 10 has measured. The integrated terminal current is represented by $\Delta Ah = A\ [previous\ time] + A\ [two\ times\ previous] + \ldots + A\ [T\ [sec]\ ago]$.

The SOH calculator 17 is configured to calculate an SOH representing an electricity storage capacity in the secondary battery 2, by using the differential estimated SOC that the differential estimated SOC calculator 15 has calculated and the integrated terminal current that the integrated terminal current calculator 16 has calculated. The electricity storage capacity in the secondary battery 2, which the SOH calculator 17 calculates, is represented by $SOH\_0 = \Delta Ah / \Delta SOC\_v \times 100$.

The SOH estimation model IS represents a model used to estimate an SOH representing an electricity storage capacity in the secondary battery 2. In a high SOC state where the estimated OCV [V] that the estimated OCV calculator 12 has calculated is at least equal to or above the first threshold value (e.g., 3.8 (V)), the SOH that the SOH calculator 17 has calculated is entered into the SOH estimation model 18 to update the SOH estimation model 18.

Specifically, in a high SOC state where the estimated OCV [V] that the estimated OCV calculator 12 has calculated is equal to or above the first threshold value (e.g., 3.8 [V]), and in a low SOC state where the estimated OCV (VI that the estimated OCV calculator 12 has calculated is below the second threshold value (e.g., 3.5 [V]) that is smaller than the first threshold value, the SOH estimation model 18 is updated by using an annealing coefficient k1 (0<k1<1). In this case, the SOH in the SOH estimation model 18 is represented by $SOH\_s = SOH\_s\ [previous\ time] \times (1-k1) + SOH\_0 \times k1$. Furthermore, in a medium SOC state where the estimated OCV [v] that the estimated OCV calculator 12 has calculated is below the first threshold value and equal to or above the second threshold value (e.g., 3.5 [V]) that is smaller than the first threshold value, the SOH estimation model 18 is updated by using an annealing coefficient k0 (0≤k0<k1). In this case, the SOH in the SOH estimation model 18 is represented by $SOH\_s = SOH\_s\ [previous\ time] \times (1-k0) + SOH\_0 \times k0$. However, when the annealing coefficient k0 is set to zero, no update takes place for the SOH estimation model 18. The SOH in the SOH estimation model 18 is then represented by SOH_s=SOH_s [previous time].

Furthermore, when an amount of heat generated in the secondary battery 2 has reached a predetermined threshold value, the SOH estimation model 18 is updated by using SOC_L [%] representing an SOC [%] corresponding to OCV_L [V]. In this case, the SOH in the SOH estimation model 18 is represented by $SOH\_s = SOH\_s\ [latest] \times (100\ [\%] - SOC\_L\ [\%])/100\ [\%]$.

The differential SOC calculator 20 is configured to calculate a differential SOC representing an amount of change, per unit time T [sec], in a percentage of charge in the secondary battery 2, by using the integrated terminal current that the integrated terminal current calculator 16 has calculated and the SOH in the SOH estimation model 18. The differential SOC is represented by $\Delta SOC\_Ah\ [\%] = \Delta Ah / SOH\_s$.

The SOC calculator 21 is configured to calculate an SOC [%] representing a percentage of charge in the secondary battery 2, by using the differential SOC that the differential SOC calculator 20 has calculated and the estimated SOC that the estimated SOC calculator 14 has calculated and acquired the unit time T [sec] ago. The SOC [%] representing a percentage of charge in the secondary battery 2 is represented by $SOC\ [\%] = SOC\ [T\ [sec]\ ago] + \Delta SOC\_Ah$.

The OCV calculator 22 is configured to calculate, from the SOC [%] that the SOC calculator 21 has calculated, an OCV representing a terminal voltage in the opened state, by using the SOC-OCV characteristic model 13.

The OCV error calculator 23 is configured to calculate an OCV error representing an error between the estimated OCV and the OCV [V], by using the estimated OCV that the estimated OCV calculator 12 has calculated and the OCV [V] that the OCV calculator 22 has calculated. The OCV error is represented by $\Delta OCV\ [V] = OCV\_Ah - OCV$. However, in this equation, the OCV_Ah [V] represents an OCV that the OCV calculator 22 calculates, and the OCV [V] represents an estimated OCV.

The heat generation amount calculator 30 is configured to calculate an amount of heat generated in the secondary battery 2, by using the state variables that the state measurer 10 has measured. That is, the heat generation amount calculator 30 is configured to calculate an amount of heat generated in the secondary battery 2, by using the temperature relating to the secondary battery 2, which the state measurer 10 has measured.

The minimum OCV calculator 31 is configured to regard the estimated OCV that the estimated OCV calculator 12 has calculated at a point of time when the amount of heat generated in the secondary battery 2 has reached a predetermined threshold value as a minimum OCV representing a minimum value of the terminal voltage in an opened state. The minimum OCV is represented by OCV_L [V].

Figure 2:
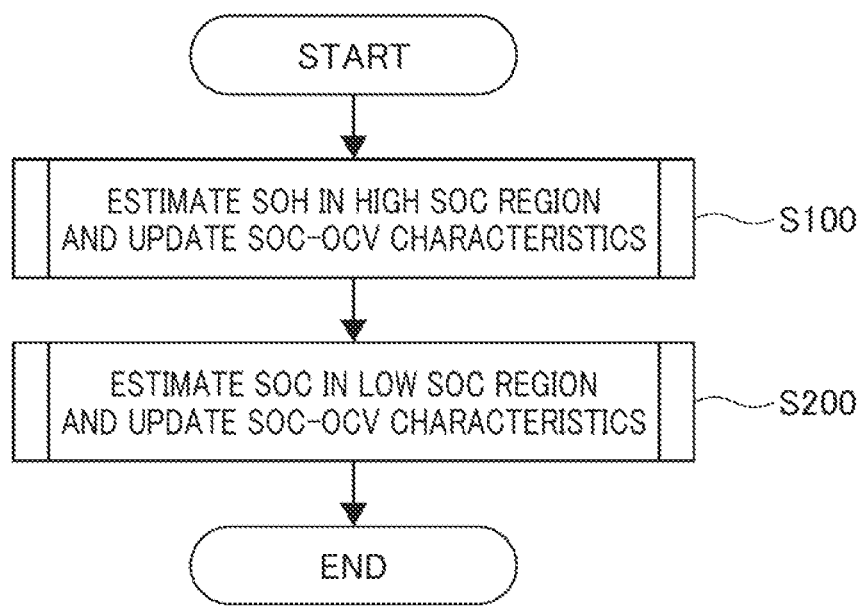
FIG. 2 is a flowchart illustrating a flow of processing performed in the secondary battery state estimation device, according to the first embodiment.

Next, a flow of processing performed in the secondary battery state estimation device 1 will now be described herein with reference to FIG. 2. FIG. 2 is a flowchart illustrating the flow of processing performed in the secondary battery state estimation device 1.

Figure 4:
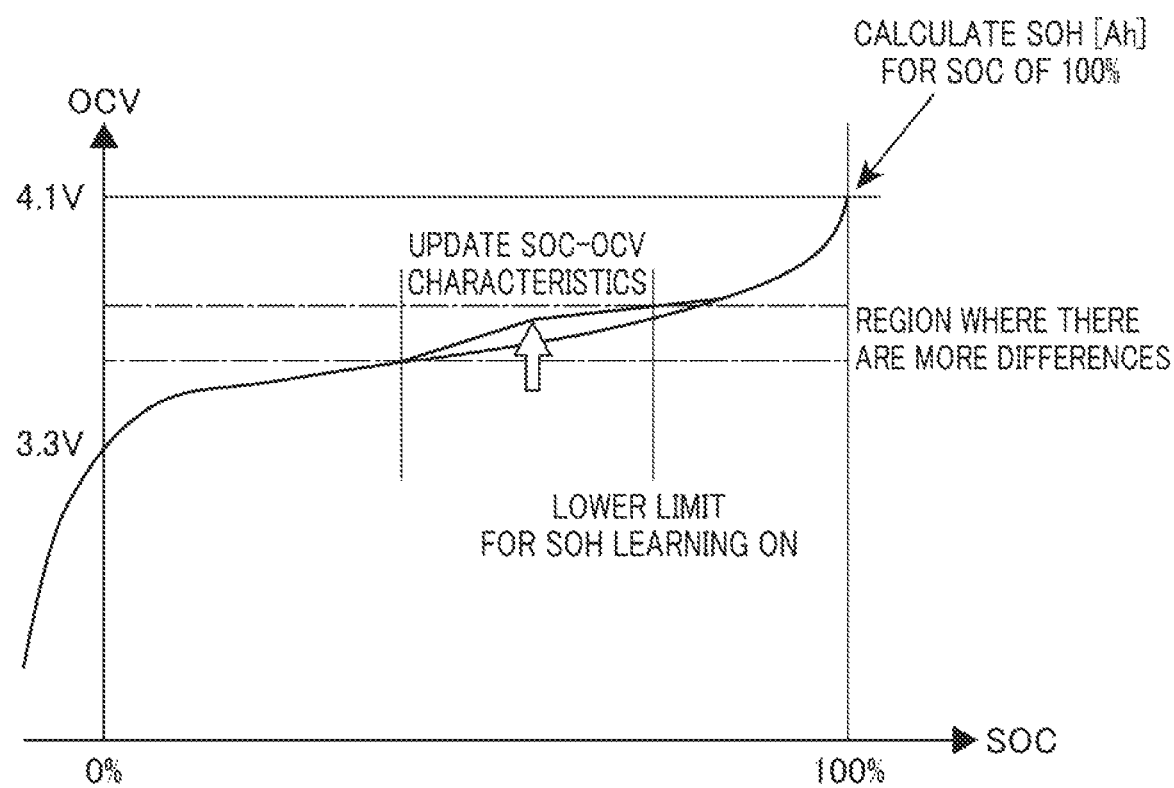
FIG. 4 is a view of an SOC-OCV characteristic model/ illustrating respective states before and after the processing performed in a region where an SOC state is at a medium level.

As illustrated in FIG. 2, step S100 represents a step for updating the SOH estimation model 18 in a case of a high SOC state where an estimated OCV [V] that the estimated OCV calculator 12 calculates is at least equal to or above the first threshold value (e.g., 3.8 [V]). Furthermore, step S100 represents a step for updating the SOC-OCV characteristic model 13 in a case of a medium SOC state where an estimated OCV [V] that the estimated OCV calculator 12 calculates is below the first threshold value (e.g., 3.8 [V])

and equal to or above the second threshold value (e.g., 3.5 [V]) that is smaller than the first threshold value (see FIG. 4).

Step S200 represents a step for updating the SOC-OCV characteristic model 13 when an amount of heat generated in the secondary battery 2 reaches a predetermined threshold value (see FIGS. 7 to 11).

Figure 3:
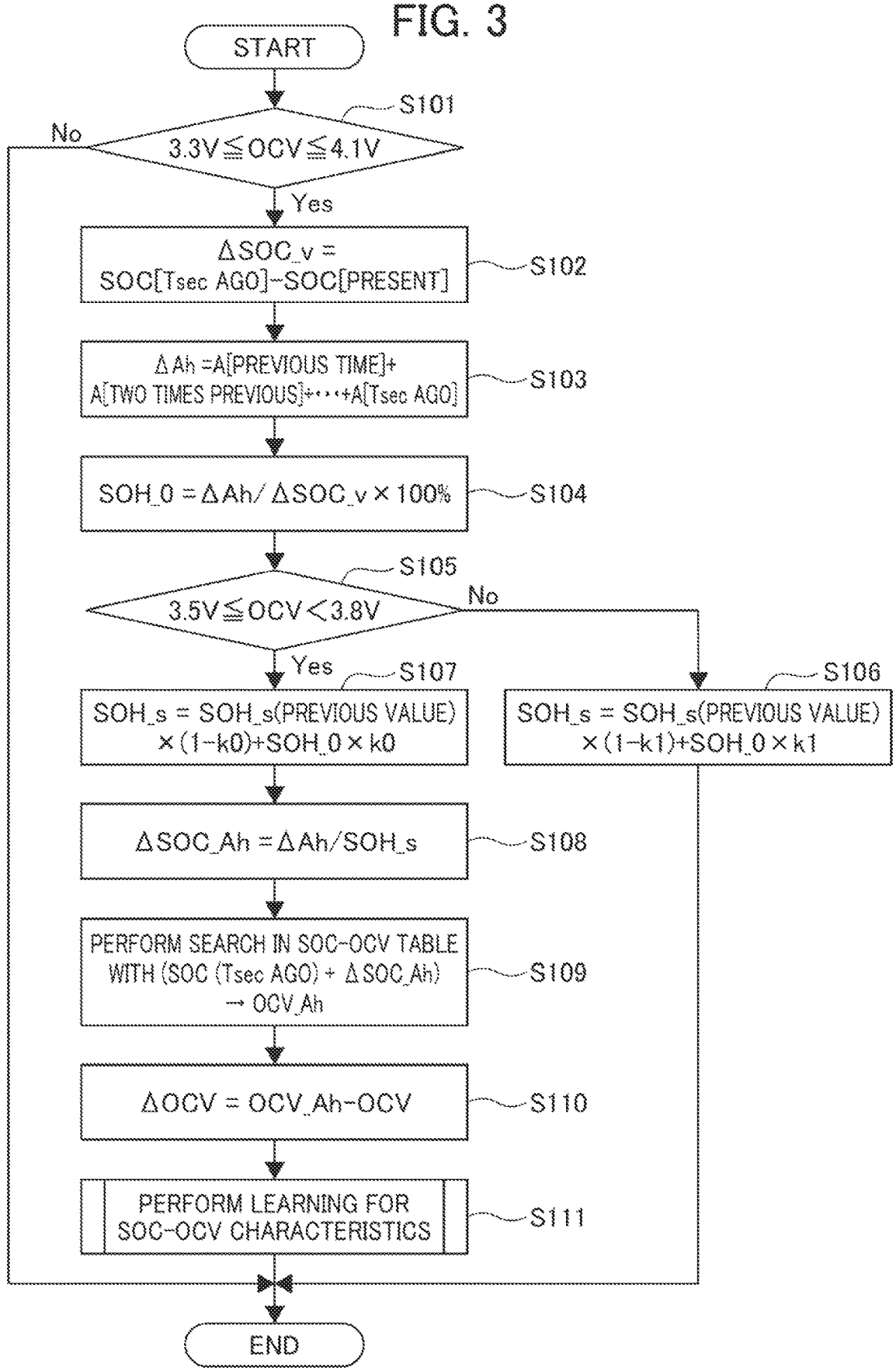
FIG. 3 is a flowchart illustrating a flow of processing performed in a region where an SOC state is at a higher level and a region where an SOC state is at a medium level.

Next, a flow of processing performed in a region where an SOC state is at a higher level and a region where an SOC state is at a medium level will now be described herein with reference to FIG. 3. FIG. 3 is a flowchart illustrating the flow of processing performed in a region where an SOC state is at a higher level and a region where an SOC state is at a medium level.

As illustrated in FIG. 3, step S101 represents a step for determining whether an estimated OCV that the estimated OCV calculator 12 calculates falls within a range satisfying 0 [%]≤SOC≤100 [%] (e.g., 3.3 [V]≤OCV≤4.1 [V]). When YES is determined at step S101, the processing proceeds to step S102. When NO is determined at step S101, the processing ends.

Step S102 represents a step for calculating a differential estimated SOC. At step S102, the internal resistance calculator 11 calculates internal resistance of the secondary battery 2. The estimated OCV calculator 12 calculates an estimated OCV. The estimated SOC calculator 14 calculates an estimated SOC. The differential estimated SOC calculator 15 calculates a differential estimated SOC. After step S102, the processing proceeds to step S103.

Step S103 represents a step for calculating an integrated terminal current. At step 3103, the integrated terminal current calculator 16 calculates an integrated terminal current. After step S103, the processing proceeds to step S104.

Step S104 represents a step for calculating an SOH representing an electricity storage capacity in the secondary battery 2. At step S104, the SOH calculator 17 calculates an SOH. After step S104, the processing proceeds to step S105.

Step S105 represents a step for determining whether the estimated OCV [V] that the estimated OCV calculator 12 has calculated is below the first threshold value (e.g., 3.8 [V]) and equal to or above the second threshold value (e.g., 3.5 [V]) that is smaller than the first threshold value, indicating a medium SOC state. When YES is determined at step S105, i.e., a medium SOC state is determined, the processing proceeds to step S107. When NO is determined at step S105, i.e., a high SOC state or a low SOC state is determined, the processing proceeds to step S106.

Step S106 represents a step for updating the SOH estimation model 18, by using the annealing coefficient k1. After step S106, the processing ends.

Step S107 represents a step for updating the SOH estimation model 18, by using the annealing coefficient k0. However, when the annealing coefficient k0 is set to zero, no update takes place for the SOH estimation model 18. After step S107, the processing proceeds to step S108.

Step S108 represents a step for calculating a differential SOC. At step S108, the differential SOC calculator 20 calculates a differential SOC. After step S108, the processing proceeds to step S109.

Step S109 represents a step for calculating an OCV [V]. At step S109, the SOC calculator 21 calculates an SOC [%]. The OCV calculator 22 calculates an OCV [V]. After step S109, the processing proceeds to step S110.

Step S110 represents a step for calculating an OCV error. At step S110, the OCV error calculator 23 calculates an OCV error. After step S110, the processing proceeds to step S111.

Step S111 represents a step for updating the SOC-OCV characteristic model 13, by using the annealing coefficient k2. After step S111, the processing ends.

Next, step S111 will now be described herein with reference to FIG. 4. FIG. 4 is a view of the SOC-OCV characteristic model 13, illustrating respective states before and after the processing performed in a region where an SOC state is at a medium level.

In FIG. 4, as indicated by an arrow, in the present embodiment, the SOC-OCV characteristic model 13 is updated in a region where an SOC state is at a medium level. Therefore, this reduces the variability of the SOC [%] in a region where an SOC state is at a medium level where the variability of the SOC [%] is large.

Figure 5:
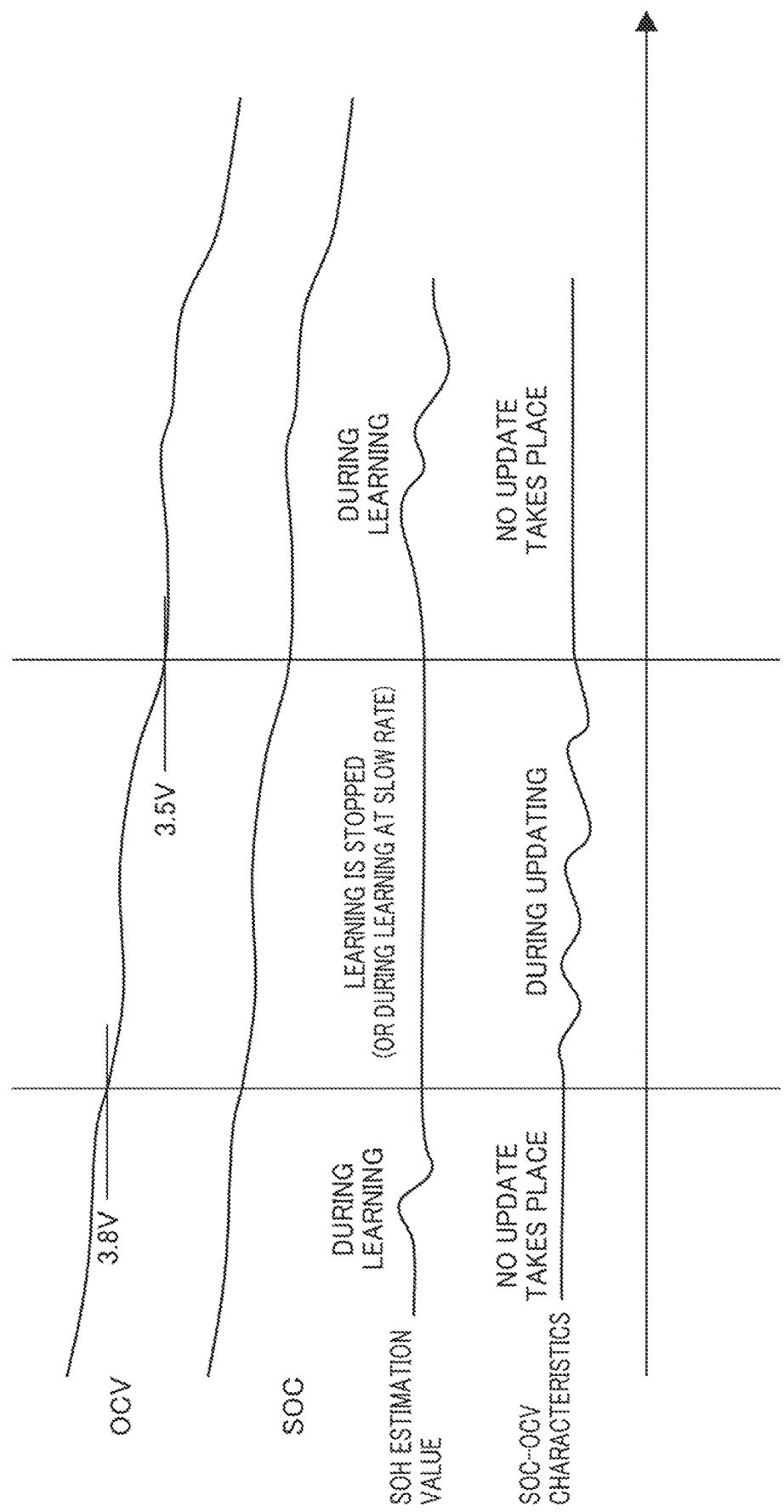
FIG. 5 is a time chart illustrating a time history of values due to discharging of electricity from the secondary battery.

Next, chronological changes in values due to discharging of electricity from the secondary battery 2 will now be described herein with reference to FIG. 5. FIG. 5 is a time chart illustrating a time history of values due to discharging of electricity from the secondary battery 2.

As illustrated in FIG. 5, an OCV [V] representing a terminal voltage in the opened state decreases as time passes. An SOC [%] representing a percentage of charge decreases as time passes.

In a high SOC state where the OCV [V] is equal to or above the first threshold value (e.g., 3.8 [V]) and in a low SOC state where the OCV [V] is below the second threshold value (e.g., 3.5 [V]), the SOH estimation model 18 is updated by using the annealing coefficient k1. That is, in a high SOC state where the OCV [V] is equal to or above the first threshold value (e.g., 3.8 [V]) and in a low SOC state where the OCV [V] is below the second threshold value (e.g., 3.5 [V]), learning is performed for the SOH estimation model 18.

On the other hand, in a medium SOC state where the OCV [V] is below the first threshold value (e.g., 3.8 [V]) and equal to or above the second threshold value (e.g., 3.5 [V]), the SOH estimation model 18 is not updated or is slowly updated, by using the annealing coefficient k0. That is, in a medium SOC state where the OCV [V] is below the first threshold value (e.g., 3.8 [V]) and equal to or above the second threshold value (e.g., 3.5 [V]), learning is stopped or learning is slowly performed for the SOH estimation model 18.

In a high SOC state where the OCV [V] is equal to or above the first threshold value (e.g., 3.8 [V]) and in a low SOC state where the OCV [V] is below the second threshold value (e.g., 3.5 [V]), no update takes place for the SOC-OCV characteristic model 13.

On the other hand, in a medium SOC state where the OCV [V] is below the first threshold value (e.g., 3.8 [V]) and equal to or above the second threshold value (e.g., 3.5 [V]), the SOC-OCV characteristic model 13 is updated.

Figure 6:
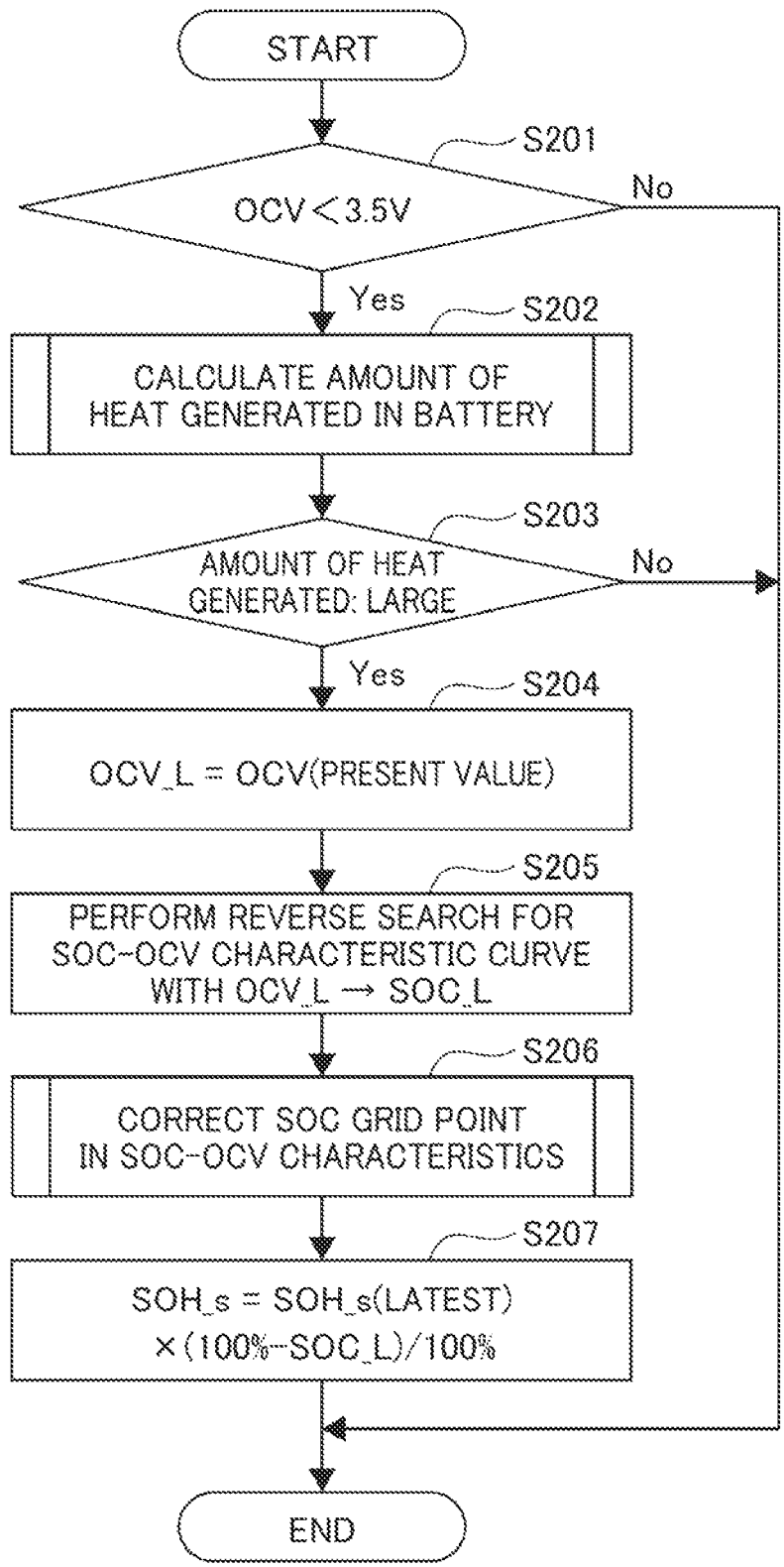
FIG. 6 is a flowchart illustrating a flow of processing performed in a region where an SOC state is at a lower level.

Next, a flow of processing performed in a region where an SOC state is at a lower level will now be described herein with reference to FIG. 6. FIG. 6 is a flowchart illustrating the flow of processing performed in a region where an SOC state is at a lower level.

As illustrated in FIG. 6, step S201 represents a step for determining whether an estimated OCV that the estimated OCV calculator 12 calculates is below the second threshold value (e.g., 3.5 [V]), indicating a low SOC state. When YES is determined at step S201, i.e., a low SOC state is determined, the processing proceeds to step S202. When NO is determined at step S201, i.e., no low SOC state is determined, the processing ends.

Step S202 represents a step for calculating an amount of heat generated in the secondary battery 2. At step S202, the heat generation amount calculator 30 calculates an amount of heat generated in the secondary battery 2. After step S202, the processing proceeds to step S203.

Step S203 represents a step for determining whether the amount of heat generated in the secondary battery 2 has reached a predetermined threshold value. When YES is determined at step S203, i.e., the amount of heat generated in the secondary battery 2 has reached the predetermined threshold value, the processing proceeds to step S204. When NO is determined at step S203, i.e., the amount of heat generated in the secondary battery 2 has not yet reached the predetermined threshold value, the processing ends.

Step S204 represents a step for regarding, as a minimum OCV, an estimated OCV at a point of time when the amount of heat generated in the secondary battery 2 has reached the predetermined threshold value. At step S204, the minimum OCV calculator 31 calculates a minimum OCV. After step S204, the processing proceeds to step S205.

Step S205 represents a step for calculating, from OCV_L [V] representing the minimum OCV, SOC_L [%] representing an SOC ([%] corresponding to the OCV_L (VI, by using the SOC-OCV characteristic model 13 (see FIG. 9). After step S205, the processing proceeds to step S206.

Figure 11:
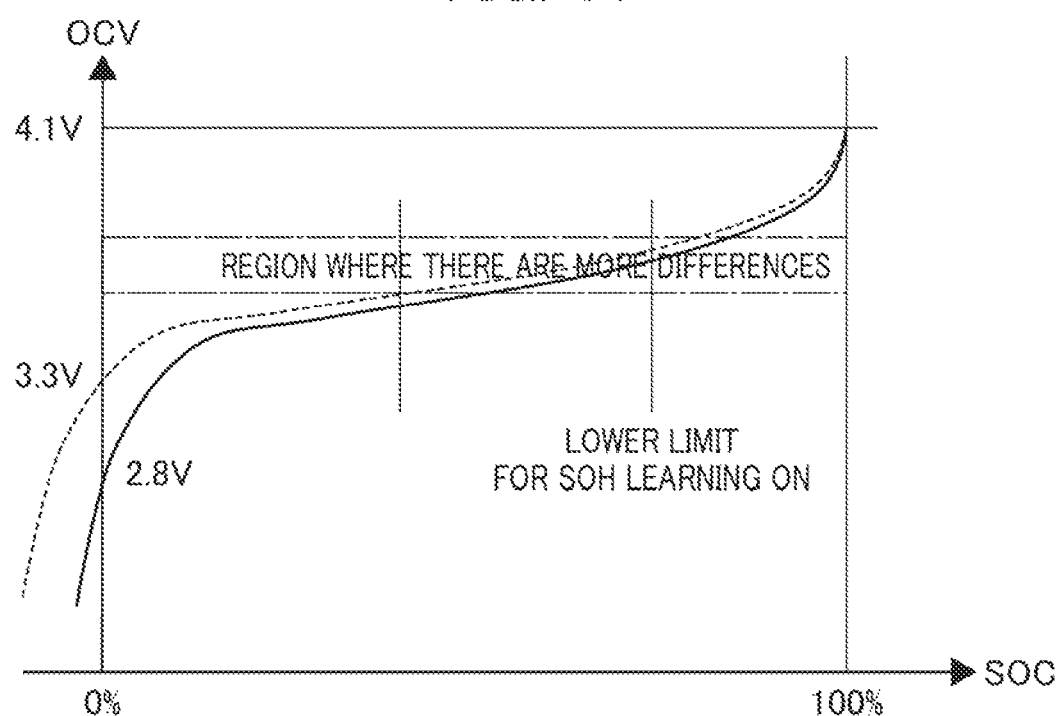
FIG. 11 is a view of an SOC-OCV characteristic model, illustrating respective states before and after the amount of heat generated in the secondary battery has reached the predetermined threshold value.

Step S206 represents a step for updating the SOC-OCV characteristic model 13, by using a predetermined conversion equation (see FIGS. 10 and 11). For example, as for grid point data when an SOC [%] is –20 [%], a conversion equation of 100 [%]/(100 [%]–SOC_L [%])×(–20[%]–SOC_L [%]) is used. As for grid point data when an SOC [%] is 0 [%], a conversion equation of 100 [%]/(100 [%]–SOC_L [%])×(0 [%]–SOC_L [%]) is used. As for grid point data when an SOC [%] is 20 [%], a conversion equation of 100 [%]/(100 [%]–SOC_L [%])×(20 [%]–SOC_L [%]) is used. As for grid point data when an SOC [%] is 100 [%], a conversion equation of 100 [%]/(100 [%]–SOC_L [%])×(100 [%]–SOC_L [%]) is used. After step S206, the processing proceeds to step S207.

Step S207 represents a step for updating the SOH estimation model 18, by using a conversion equation of SOH_s=SOH_s (latest)×(100%–SOC_L)/100%. After step S207, the processing ends.

Figure 7:
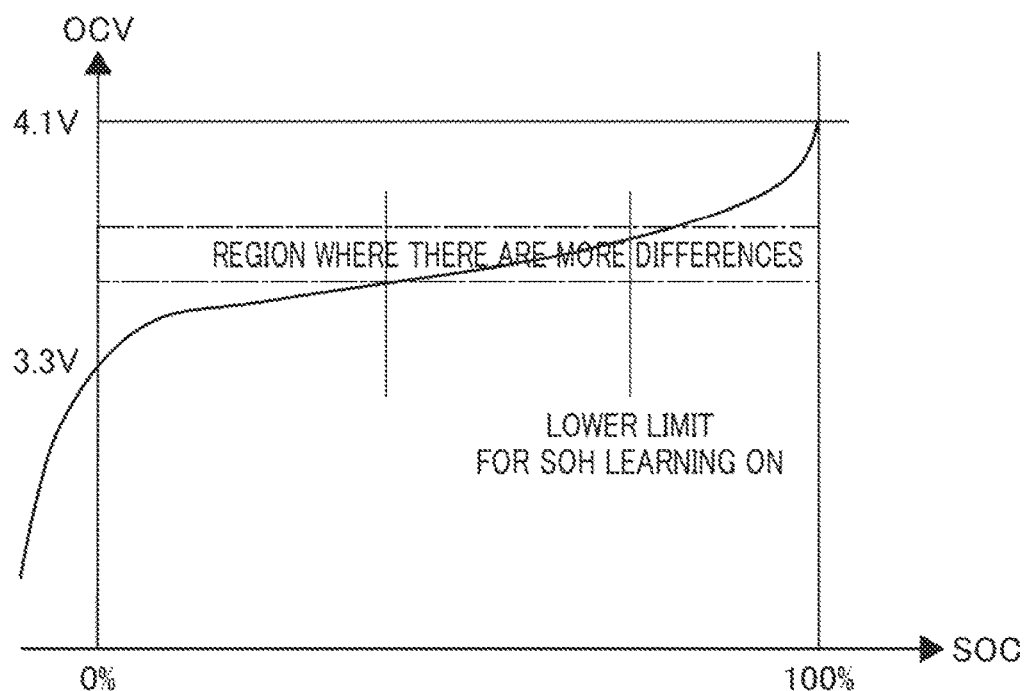
FIG. 7 is a view of an SOC-OCV characteristic model/ illustrating a state before an amount of heat generated in the secondary battery has reached a predetermined threshold value.
Figure 8:
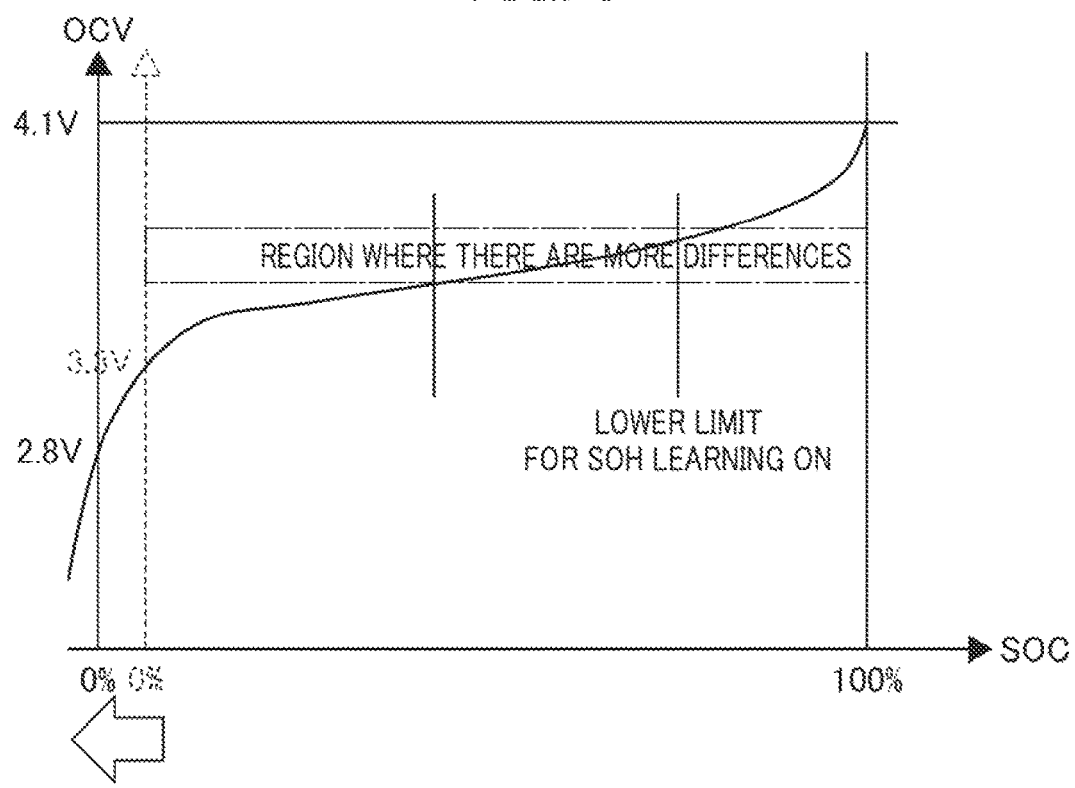
FIG. 8 is a view of an SOC-OCV characteristic model/ illustrating a state after the amount of heat generated in the secondary battery has reached the predetermined threshold value.

Next, processing when an amount of heat generated in the secondary battery 2 reaches a predetermined threshold value will now be described herein with reference to FIGS. 7 to 11. FIG. 7 is a view of the SOC-OCV characteristic model 13, illustrating a state before an amount of heat generated in the secondary battery 2 has reached the predetermined threshold value. FIG. 8 is a view of the SOC-OCV characteristic model 13, illustrating a state after the amount of heat generated in the secondary battery 2 has reached the predetermined threshold value. FIG. 9 is a table of the SOC-OCV characteristic model 13, illustrating an SOC (SOC_L) corresponding to an estimated OCV (OCV_L) at a point of time when the amount of heat generated in the secondary battery 2 has reached the predetermined threshold value. FIG. 10 is a table of an SOC-OCV characteristic model, illustrating calculating equations for updating an SOC in each grid point data. FIG. 11 is a view of the SOC-OCV characteristic model 13, illustrating respective states before and after the amount of heat generated in the secondary battery 2 has reached the predetermined threshold value.

As illustrated in FIG. 7, in the SOC-OCV characteristic model 13, when OCV=3.3 [V], SOC=0 [%] is attained. However, when a point of time when the amount of heat generated in the secondary battery 2 has reached the predetermined threshold value is regarded as SOC=0 [%], as illustrated in FIG. 8, in the SOC-OCV characteristic model 13, when OCV=2.8 [V], SOC=0[%] is attained. In this case, as illustrated in FIG. 9, an SOC (SOC_L) corresponding to an estimated OCV (OCV_L) at a point of time when the amount of heat generated in the secondary battery 2 has reached the predetermined threshold value is calculated. After that, the conversion equations illustrated in FIG. 10, which are described above for step S206, are used to update the SOC in each grid point data by changing its scale. As a result, as illustrated in FIG. 11, the SOC-OCV characteristic model 13 is updated.

Figure 12:
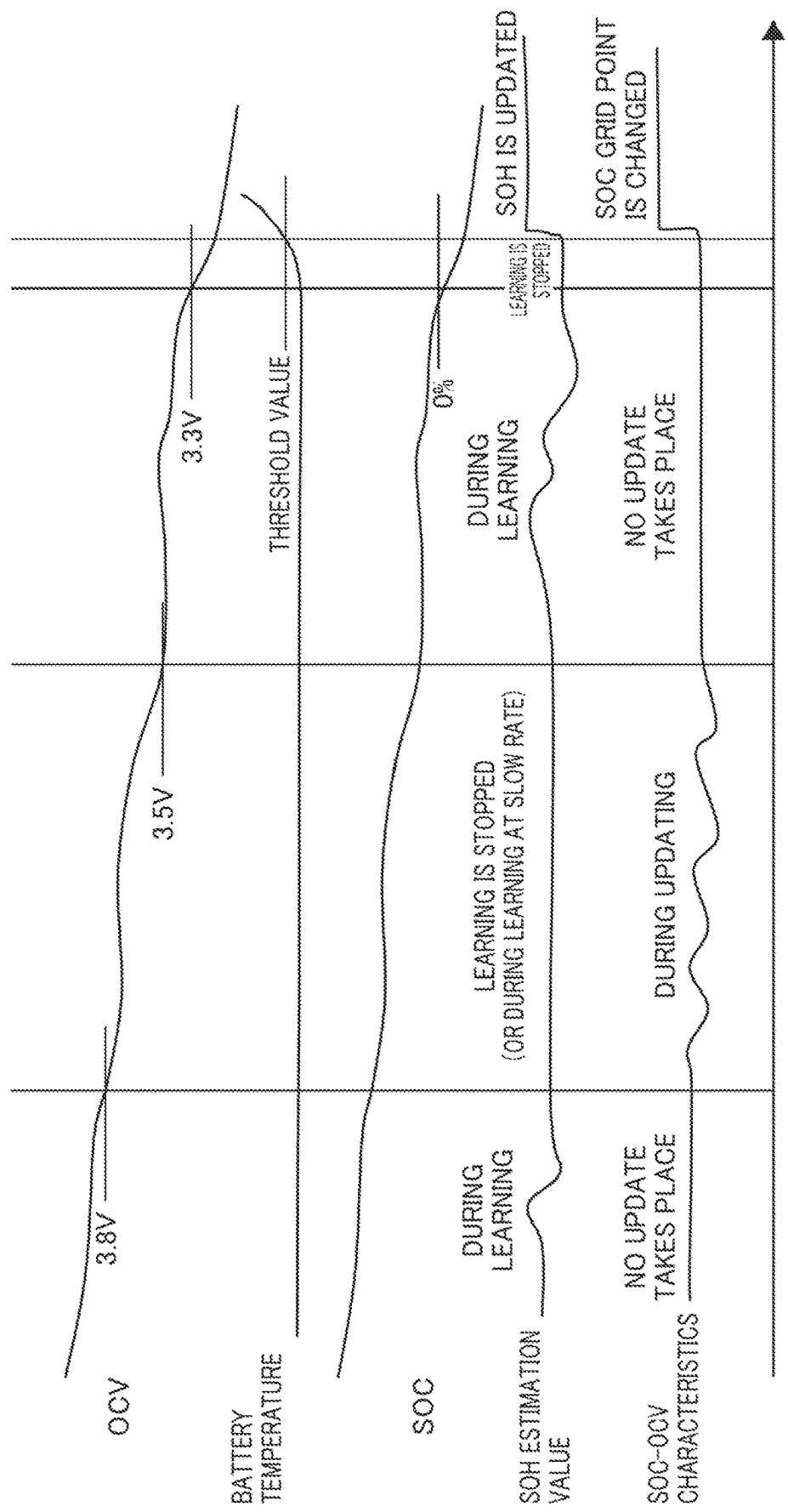
FIG. 12 is a time chart illustrating a time history of values due to discharging of electricity from the secondary battery.

Next, chronological changes in values due to discharging of electricity from the secondary battery 2 will now be described herein with reference to FIG. 12. FIG. 12 is a time chart illustrating a time history of values due to discharging of electricity from the secondary battery 2. Note that descriptions for those that are similar or identical to those illustrated in FIG. 5 are omitted.

A timing when an SOC [%] representing a percentage of charge in the secondary battery 2 actually reaches zero differs from a timing when the SOC [%] in the SOC-OCV characteristic model 13 reaches zero. It is assumed in here that a timing when an SOC [%] representing a percentage of charge in the secondary battery 2 actually reaches zero corresponds to a timing after the SOC [%] in the SOC-OCV characteristic model 13 has reached a minus value.

A timing when an SOC [%] representing a percentage of charge in the secondary battery 2 actually reaches zero corresponds to a point of time when an amount of heat generated in the secondary battery 2 has reached the predetermined threshold value. That is, a point of time when an amount of heat generated in the secondary battery 2 has reached the predetermined threshold value corresponds to a timing after the SOC [%] in the SOC-OCV characteristic model 13 has reached a minus value.

Learning for the SOH estimation model 18 stops at a point of time when the SOC [V] in the SOC-OCV characteristic model 13 has reached zero. After that, the SOH estimation model 18 is updated after the amount of heat generated in the secondary battery 2 has reached the predetermined threshold value.

After the amount of heat generated in the secondary battery 2 has reached the predetermined threshold value, the SOC-OCV characteristic model 13 is updated.

In a region where an SOC state is at a higher level where an estimated OCV is equal to or above the first threshold value, the SOC-OCV characteristic models 13 for various types of secondary batteries 2 have relatively less variability. Therefore, according to the secondary battery state estimation device 1, it is possible to accurately perform re-learning for the SOH estimation model 18 in a region where an SOC state is at a higher level.

In a region where an SOC state is at a medium level where an estimated OCV is below the first threshold value and equal to or above the second threshold value, the SOC-OCV characteristic models for various types of secondary batteries have relatively more variability. Therefore, according to the secondary battery state estimation device 1, re-learning for the SOH estimation model 18 is not performed in a region where an SOC state is at a medium level. However, the processing pertaining to steps S107 to S111 is performed. It is thus possible to perform learning for the SOC-OCV characteristic model 13 that is unknown.

Furthermore, according to the secondary battery state estimation device 1, it is possible to perform learning for an unknown SOC-OCV characteristic model, based on an estimated OCV at a point of time when an amount of heat generated in the secondary battery 2 has reached a predetermined threshold value.

Second Embodiment

Figure 13:
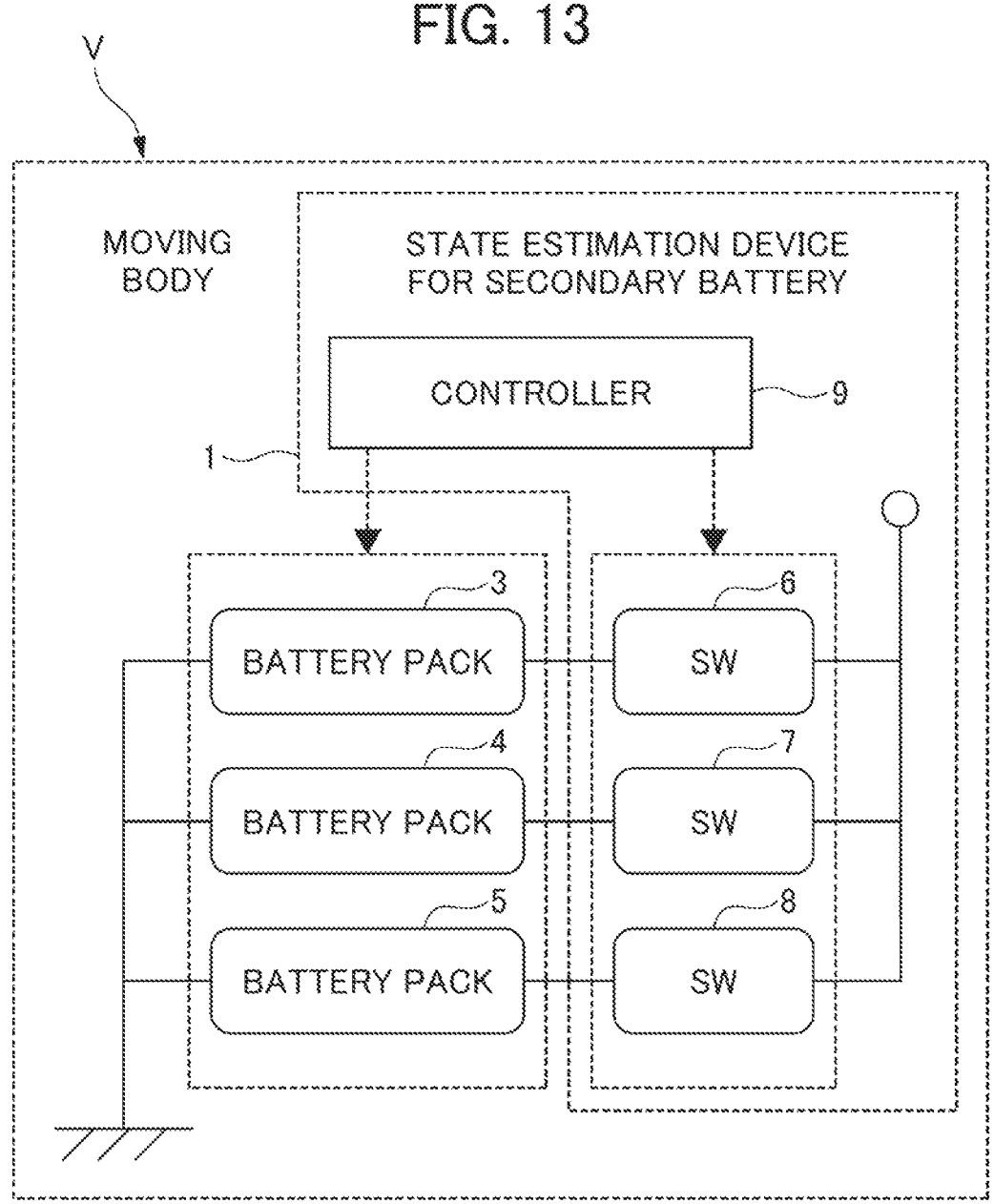
FIG. 13 is a block diagram illustrating a configuration of a moving body adopted with a secondary battery state estimation device, according to a second embodiment.

Next, a configuration of the moving body V adopted with the secondary battery state estimation device 1, according to the second embodiment of the present invention, will now be described herein with reference to FIG. 13. FIG. 13 is a block diagram illustrating the configuration of the moving body V adopted with the secondary battery state estimation device 1.

As illustrated in FIG. 13, the moving body V includes the secondary battery state estimation device 1, and a plurality of battery packs 3, 4, 5 each incorporating a secondary battery (not illustrated), for example. The secondary battery state estimation device 1 includes, in addition to a configuration that is similar or identical to the configuration of the first embodiment, a plurality of coupling switches 6, 7, 8 and a controller 9, for example.

The plurality of battery packs 3, 4, 5 each include at least one secondary battery (not illustrated) that is similar or identical to the secondary battery 2 (see FIG. 1) according to the first embodiment. The plurality of battery packs 3, 4, 5 are coupled in parallel to each other.

The plurality of coupling switches 6, 7, 8 are respectively provided in a corresponding manner to the plurality of battery packs 3, 4, 5. The coupling switch 6 is configured to be switched between a coupled state and a decoupled state for supplying of electric power from the battery pack 3. The coupling switch 7 is configured to be switched between the coupled state and the decoupled state for supplying of electric power from the battery pack 4. The coupling switch 8 is configured to be switched between the coupled state and the decoupled state for supplying of electric power from the battery pack 5.

The controller 9 is configured to control the plurality of coupling switches 6, 7, 8. Specifically, the controller 9 switches, when an output that the moving body V requires is equal to or below a predetermined value, the plurality of coupling switches 6, 7, 8 to the coupled state one by one in order to sequentially update the SOC-OCV characteristic model 13 (see FIG. 1) in each of the plurality of battery packs 3, 4, 5. Furthermore, the controller 9 switches, when the output that the moving body V requires is equal to or below the predetermined value, the plurality of coupling switches 6, 7, 8 to the coupled state one by one in order, each time charging and discharging of electricity take place. The controller 9 controls the plurality of coupling switches 6, 7, 8 based on flag determinations.

Figure 14:
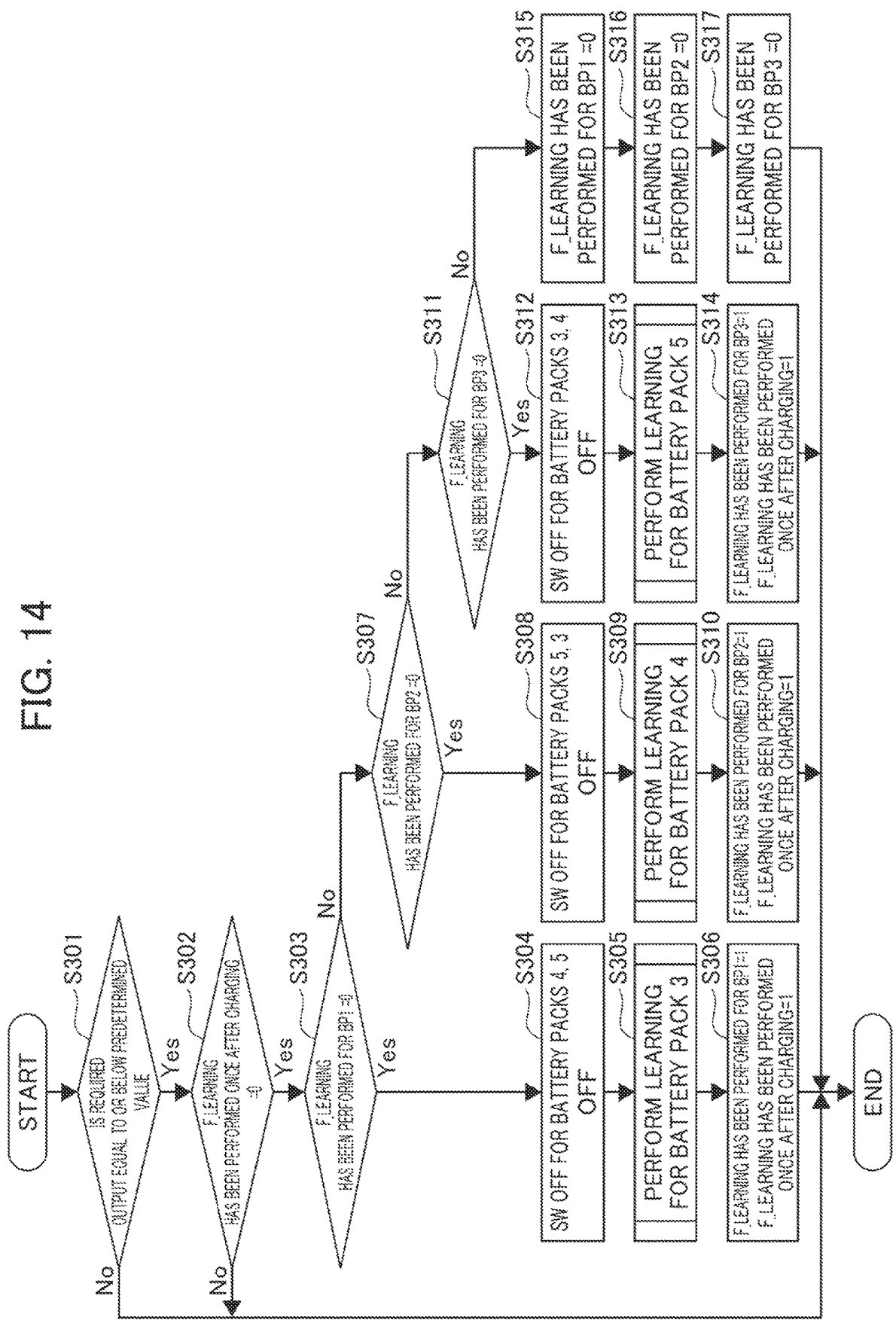
FIG. 14 is a flowchart illustrating a flow of processing performed in the secondary battery state estimation device, according to the second embodiment.

Next, a flow of processing performed in the secondary battery state estimation device 1 will now be described herein with reference to FIG. 14. FIG. 14 is a flowchart illustrating a flow of processing performed in the secondary battery state estimation device 1.

As illustrated in FIG. 14, step S301 represents a step for determining whether an output that the moving body V requires is equal to or below a predetermined value (e.g., 10% of a maximum output). When YES is determined at step S301, the processing proceeds to step S302. When NO is determined at step S301, the processing ends.

At step S302, it is determined whether a flag indicating "F_learning has been performed once after charging" has been cleared to 0. The flag indicating "F_learning has been performed once after charging" is cleared to 0 when the plurality of battery packs 3, 4, 5 have wholly been charged to a predetermined value (e.g., 50%) or above. When YES is determined at step S302, the processing proceeds to step S303. When NO is determined at step S302, the processing ends.

At step S303, it is determined whether a flag indicating "F_learning has been performed for BP1" has been cleared to 0. When YES is determined at step S303, the processing proceeds to step S304. When NO is determined at step S303, the processing proceeds to step S307.

Step S304 represents a step for switching the coupling switches 7, 8 corresponding to the battery packs 4, 5 to the decoupled state. At step S304, the coupling switch 6 is only switched to the coupled state. After step S304, the processing proceeds to step S305.

Step S305 represents a step for performing learning for the battery pack 3. At step S305, learning for the SOC-OCV characteristic model 13 (see FIG. 1) in the battery pack 3 is performed. After step S305, the processing proceeds to step S306.

Step S306 represents a step for setting the flag indicating "F_learning has been performed for BP1" to 1, and for setting the flag indicating "F_learning has been performed once after charging" to 1. After step S306, the processing ends.

At step S307, it is determined whether a flag indicating "F_learning has been performed for BP2" has been cleared to 0. When YES is determined at step S307, the processing proceeds to step S308. When NO is determined at step S307, the processing proceeds to step S311.

Step S308 represents a step for switching the coupling switches 8, 6 corresponding to the battery packs 5, 3 to the decoupled state. At step S308, the coupling switch 7 is only switched to the coupled state. After step S308, the processing proceeds to step S309.

Step S309 represents a step for performing learning for the battery pack 4. At step S309, learning for the SOC-OCV characteristic model 13 (see FIG. 1) in the battery pack 4 is performed. After step S309, the processing proceeds to step 3310.

Step S310 represents a step for setting the flag indicating "F_learning has been performed for BP2" to 1, and for setting the flag indicating "F_learning has been performed once after charging" to 1. After step S310, the processing ends.

At step 3311, it is determined whether a flag indicating "F_learning has been performed for BP3" has been cleared to 0. When YES is determined at step S311, the processing proceeds to step 3312. When NO is determined at step S311, the processing proceeds to step S315.

Step S312 represents a step for switching the coupling switches 6, 7 corresponding to the battery packs 3, 4 to the decoupled state. At step S312, the coupling switch 8 is only switched to the coupled state. After step S312, the processing proceeds to step S313.

Step S313 represents a step for performing learning for the battery pack 5. At step S313, learning for the SOC-OCV characteristic model 13 (see FIG. 1) in the battery pack 5 is performed. After step S313, the processing proceeds to step S314.

Step S314 represents a step for setting the flag indicating "F_learning has been performed for BP3" to 1, and for setting the flag indicating "F_learning has been performed once after charging" to 1. After step S314, the processing ends.

Step S315 represents a step for clearing the flag indicating "F_learning has been performed for BP1" to 0. After step S315, the processing proceeds to step S316.

Step S316 represents a step for clearing the flag indicating "F_learning has been performed for BP2" to 0. After step S316, the processing proceeds to step 3317.

Step S317 represents a step for clearing the flag indicating "F_learning has been performed for BP3" to 0. After step S317, the processing ends.

According to the secondary battery state estimation device 1, before a whole SOC of the plurality of battery packs 3, 4, 5 reaches 0%, an OCV at which the SOC reaches 0%; is sequentially updated for each of the battery packs 3, 4, 5. Therefore, it is possible to prevent the whole SOC in the plurality of battery packs 3, 4, 5 from reaching 09.

Note that the present invention is not limited to the embodiments described above. The present invention still includes amendments and modifications, for example, that fall within the scope of the present invention, as long as it is possible to achieve the object of the present invention.

EXPLANATION OF REFERENCE NUMERALS

1 STATE ESTIMATION DEVICE FOR SECONDARY BATTERY
2 SECONDARY BATTERY
3, 4, 5 BATTERY PACK
6, 7, 8 COUPLING SWITCH
9 CONTROLLER
10 STATE MEASURER
11 INTERNAL RESISTANCE CALCULATOR
12 ESTIMATED OCV CALCULATOR
13 SOC-OCV CHARACTERISTIC MODEL
14 ESTIMATED SOC CALCULATOR
15 DIFFERENTIAL ESTIMATED SOC CALCULATOR
16 INTEGRATED TERMINAL CURRENT CALCULATOR
17 SOH CALCULATOR
18 SOH ESTIMATION MODEL
20 DIFFERENTIAL SOC CALCULATOR
21 SOC CALCULATOR
22 OCV CALCULATOR
23 OCV ERROR CALCULATOR
30 HEAT GENERATION AMOUNT CALCULATOR
31 MINIMUM OCV CALCULATOR
V MOVING BODY

What is claimed is:

1. A secondary battery state estimation device, comprising;
    a state measurer configured to measure, at predetermined time intervals, state variables including a terminal current and a terminal voltage of the secondary battery when in operation;
    an internal resistance calculator configured td calculate internal resistance of the secondary battery, by using the state variables;
    an estimated open-circuit-voltage (OCV) calculator configured to calculate an estimated OCV representing an estimated value of the terminal voltage in an opened state, by using the state variables and the internal resistance;
    an estimated state-of-charge (SOC) calculator configured to calculate, from the estimated OCV, an estimated SOC representing an estimated value of a percentage of charge in the secondary battery, by using an SOC-OCV characteristic model representing a relationship between an SOC representing a percentage of charge in the secondary battery and an OCV representing the terminal voltage in the opened state;
    a differential estimated SOC calculator configured to calculate a differential estimated SOC representing an amount of change, per unit time, in the estimated SOC, by using the estimated SOC;
    an integrated terminal current calculator configured to calculate an integrated terminal current representing an integrated amount, per unit time, of the terminal current, by using the state variables; and
    a state-of-health (SOH) calculator configured to calculate an SOH representing an electricity storage capacity in the secondary battery, by using the differential estimated SOC and the integrated terminal current,
    a plurality of battery packs each at least including the secondary battery, the plurality of battery packs being coupled in parallel to each other;
    a plurality of coupling switches respectively provided in a corresponding manner to the plurality of battery packs, the plurality of coupling switches being each configured to be switched between a coupled state and a decoupled state for supplying of electric power from each of the battery packs; and
    a controller configured to control the plurality of coupling switches,
    the controller controlling the plurality of coupling switches to switch only one of the plurality of coupling switches to the coupled state to sequentially update the SOC-OCV characteristic model in each of the plurality of battery packs,
    wherein the SOH that the SOH calculator has calculated in a high SOC state where at least the estimated OCV is equal to or above a first threshold value is entered into an SOH estimation model used to estimate the SOH to update the SOH estimation model,
    wherein
    the state variables include a temperature relating to the secondary battery,
    the secondary battery state estimation device includes:
    a heat generation amount calculator configured to calculate an amount of heat generated in the secondary battery, by using the state variables; and
    a minimum OCV calculator configured to regard the estimated OCV at a point of time when the amount of heat generated has reached a predetermined threshold value as a minimum OCV representing a minimum value of the terminal voltage in the opened state, and
    the minimum OCV is entered into the SOC-OCV characteristic model to update the SOC-OCV characteristic model.

2. The secondary battery state estimation device according to claim 1, wherein the controller controls, each time charging and discharging of electricity take place, the plurality of coupling switches to switch only one of the plurality of coupling switches to the coupled state to sequentially update the SOC-OCV characteristic model in each of the plurality of battery packs.

* * * * *